(12) United States Patent
Guo et al.

(10) Patent No.: US 9,978,331 B2
(45) Date of Patent: May 22, 2018

(54) DIGITAL TO ANALOG CONVERSION MODULE, DATA DRIVE CIRCUIT AND LIQUID CRYSTAL DISPLAY

(71) Applicant: Shenzhen China Star Optoelectronics Technology Co., Ltd., Shenzhen, Guangdong (CN)

(72) Inventors: Dongsheng Guo, Guangdong (CN); Mingliang Wang, Guangdong (CN)

(73) Assignee: Shenzhen China Star Optoelectronics Technology Co., Ltd, Shenzhen, Guangdong (CN)

(*) Notice: Subject to any disclaimer, the term of this patent is extended or adjusted under 35 U.S.C. 154(b) by 261 days.

(21) Appl. No.: 15/032,571

(22) PCT Filed: Feb. 25, 2016

(86) PCT No.: PCT/CN2016/074521
§ 371 (c)(1),
(2) Date: Apr. 27, 2016

(87) PCT Pub. No.: WO2017/128463
PCT Pub. Date: Aug. 3, 2017

(65) Prior Publication Data
US 2018/0061354 A1    Mar. 1, 2018

(30) Foreign Application Priority Data

Jan. 27, 2016 (CN) .......................... 2016 1 0057139

(51) Int. Cl.
*G09G 3/36* (2006.01)
*H03M 1/66* (2006.01)

(52) U.S. Cl.
CPC ............ *G09G 3/3685* (2013.01); *H03M 1/66* (2013.01); *G09G 2310/027* (2013.01)

(58) Field of Classification Search
CPC .. G09G 3/3685; G09G 2310/027; H03M 1/66
See application file for complete search history.

(56) References Cited

U.S. PATENT DOCUMENTS

2005/0171991 A1* 8/2005 Zebedee ............... H03M 1/804
708/801
2016/0253939 A1* 9/2016 Zeng ....................... H03M 1/66
345/690

* cited by examiner

*Primary Examiner* — Abhishek Sarma
(74) *Attorney, Agent, or Firm* — Andrew C. Cheng

(57) ABSTRACT

The present invention discloses a digital to analog conversion module, a data drive circuit and a liquid crystal display, wherein the digital to analog conversion module can comprise 2N-1 sub circuits and 2N-1-1 first divider resistors, and each sub circuit comprises a second divider resistor, a first switch circuit and a second switch circuit, wherein the first switch circuit and the second switch circuit are respectively coupled to two ends of the second divider resistor; the first switch circuit comprises N first switch units coupled in series, and the second switch circuit comprises a second switch unit and at least one first switch unit coupled in series; according to a preset order, a control end of the second switch unit is coupled to a connection node of a N-1th and a Nth first switch units; an output end of the second switch unit is coupled to the first switch unit.

20 Claims, 5 Drawing Sheets

DIGITAL TO ANALOG CONVERSION MODULE, DATA DRIVE CIRCUIT AND LIQUID CRYSTAL DISPLAY

CROSS REFERENCE

This application claims the priority of Chinese Patent Application No. 201610057139.9, entitled "Digital to analog conversion module, data drive circuit and liquid crystal display", filed on Jan. 27, 2016, the disclosure of which is incorporated herein by reference in its entirety.

FIELD OF THE INVENTION

The present invention relates to a display technology field, and more particularly to a digital to analog conversion module, a data drive circuit and a liquid crystal display.

BACKGROUND OF THE INVENTION

One kind of flat panel display with more application in the present market is the Liquid Crystal Display (LCD). The Liquid Crystal Display comprises a liquid crystal panel and a digital drive circuit. The digital drive circuit outputs the analog voltages to drive the liquid crystal display panel for display. The digital drive circuit comprises a digital to analog conversion module. The digital to analog conversion module achieves the function of converting the inputted digital signals into the analog voltages.

In prior art, the Digital Analog Converter (DAC) module of the liquid crystal display comprises a plurality of divider resistors, a plurality of gate circuits and a plurality of transistors. 3 bit digital drive data is illustrated. FIG. 1 is a circuit diagram of one channel in a 3 bit DAC module. As shown in FIG. 1, each channel comprises 23-1 divider resistors and 23 switch circuits. Each switch circuit comprises 3 transistors and 0 to 3 NOT gate circuits, which has 23*3 transistors in total. Each time, one set of digital signals is inputted, only one switch circuit is conducted, the outputted analog voltage is the divider voltage of the conducted switch circuit. However, in practical usage, the digital drive data of the liquid crystal display is the digital signal of at least 8 bit. Then, each channel of the DAC module requires at least 28*8=2048 transistors. Consequently, the common DAC module with 960 channels requires 960*2048=1966080 transistors. Thus, the amount of the transistors in the DAC module of the liquid crystal display according to prior art is tremendously huge. Not only the hardware cost is higher, and the larger chip area is occupied.

SUMMARY OF THE INVENTION

The embodiment of the present invention provides a digital to analog conversion module, a data drive circuit and a liquid crystal display, which can decrease the amount of the transistors in the DAC module, and thus to save the circuit cost and the occupied area of the board.

First, the embodiment of the present invention provides a digital to analog conversion DAC module, wherein the DAC module comprises 2N−1 sub circuits and 2N−1−1 first divider resistors employed to coupled to the 2N−1 sub circuits, and each sub circuit comprises a second divider resistor, a first switch circuit and a second switch circuit, wherein:

the first switch circuit and the second switch circuit are respectively coupled to two ends of the second divider resistor, and for the first switch circuit or the second switch circuit, one end coupled to the second divider resistor is an input end, and the other end is an output end;

the first switch circuit comprises N first switch units coupled in series, and the second switch circuit comprises a second switch unit and at least one first switch unit coupled in series;

according to a preset order, a control end of the second switch unit is coupled to a connection node of a N−1th first switch unit and a Nth first switch unit; an output end of the second switch unit is coupled to the at least one first switch unit;

wherein the preset order is an order from an input end to an output end, and N≥3 and N is an integer.

In some possible embodiments, the second switch circuit comprises one second switch unit and two first switch units, wherein:

an input end of the second switch unit is grounded, and an output end of the second switch unit is coupled to a control end of one first switch unit in the two first switch units;

an input end of the one first switch unit is coupled to one end of the second divider resistor, and an output end of the one first switch unit is coupled to an input end of the other first switch unit in the two first switch units;

an output end of the other first switch unit is an output end of the second divider resistor.

In some possible embodiments, the second switch circuit comprises one second switch unit and one first switch unit, wherein:

an input end of the second switch unit is coupled to one end of the second divider resistor, and an output end of the second switch unit is coupled to an input end of the one first switch unit, and an output end of the one first switch unit is an output end of the second divider resistor.

In some possible embodiments, according to the preset order, as the first N−1 first switch units of the first switch circuit are all conducted, only one of the Nth first switch unit of the first switch circuit and the second switch circuit is conducted.

In some possible embodiments, in the Nth first switch unit of the first switch circuit, M first switch units comprise NOT gates and first transistors coupled in series, and N−M first switch units comprise first transistors, wherein M is an integer and 0≤M≤N;

arrangements of the NOT gates of the respective first switch units in the DAC module are different.

In some possible embodiments, the second switch unit comprises a second transistor.

In some possible embodiments, according to the preset order, control ends of the first N−1 first switch units of the first switch circuit are respectively employed to receive first N−1 bits data of N bits digital drive data; a control end of the Nth first switch unit of the first switch circuit and a control end of the last first switch unit of the second switch circuit are employed to receive a Nth bit data of the N bits digital drive data.

In some possible embodiments, the first transistor is a P channel MOS transistor, and the second transistor is an N channel MOS transistor.

Second, the embodiment of the present invention provides a data drive circuit, which can comprise a data logic control module, at least one digital to analog conversion DAC module as provided at first or any possible embodiments at first and a power amplifier module.

Third, the embodiment of the present invention provides a liquid crystal display, which can comprise the data drive circuit at second and a liquid crystal panel.

In the embodiment of the present invention, the DAC module comprises 2N−1 sub circuits and 2N−1−1 first divider resistors employed to coupled to the 2N−1 sub circuits, and each sub circuit comprises a second divider resistor, a first switch circuit and a second switch circuit, and the first switch circuit comprises N first switch units coupled in series, and the second switch circuit comprises a second switch unit and at least one first switch unit coupled in series, and The on-off of the second switch unit in the second switch circuit is controlled with the first switch unit in the first switch circuit to decrease the amount of the transistors in the DAC module, and thus to save the circuit cost and the occupied area of the board.

BRIEF DESCRIPTION OF THE DRAWINGS

In order to more clearly illustrate the embodiments of the present invention or prior art, the following figures will be described in the embodiments are briefly introduced. It is obvious that the drawings are merely some embodiments of the present invention, those of ordinary skill in this field can obtain other figures according to these figures without paying the premise.

DETAILED DESCRIPTION OF PREFERRED EMBODIMENTS

Embodiments of the present invention are described in detail with the technical matters, structural features, achieved objects, and effects with reference to the accompanying drawings as follows. It is clear that the described embodiments are part of embodiments of the present invention, but not all embodiments. Based on the embodiments of the present invention, all other embodiments to those of ordinary skill in the premise of no creative efforts obtained, should be considered within the scope of protection of the present invention.

The embodiment of the present invention provides a digital to analog conversion module, a data drive circuit and a liquid crystal display, which can decrease the amount of the transistors in the DAC module, and thus to save the circuit cost and the occupied area of the board. The embodiment of the present invention will be further described in detail with the accompanying drawings.

Figure 1:
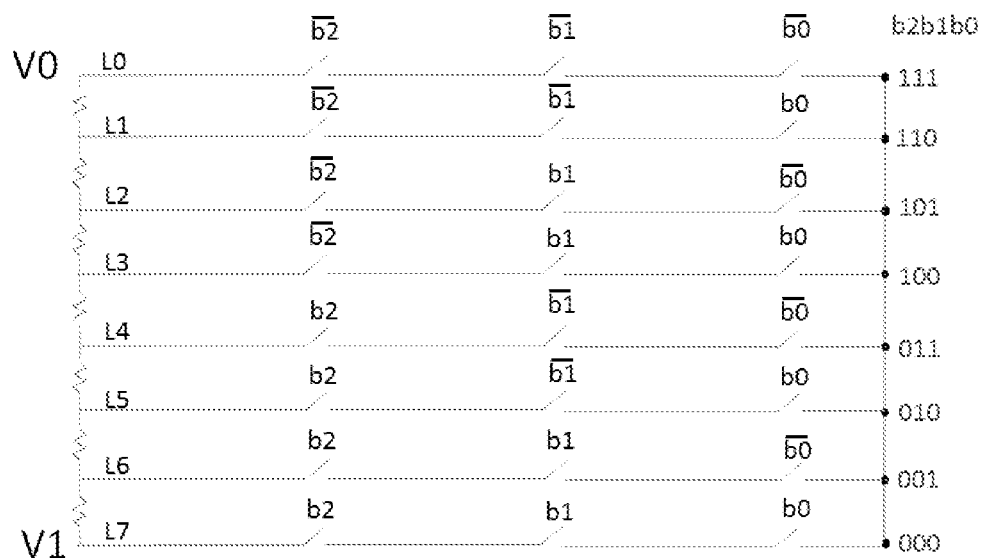
FIG. 1 is a circuit diagram of a 3 bit DAC module according to prior art.
Figure 2:
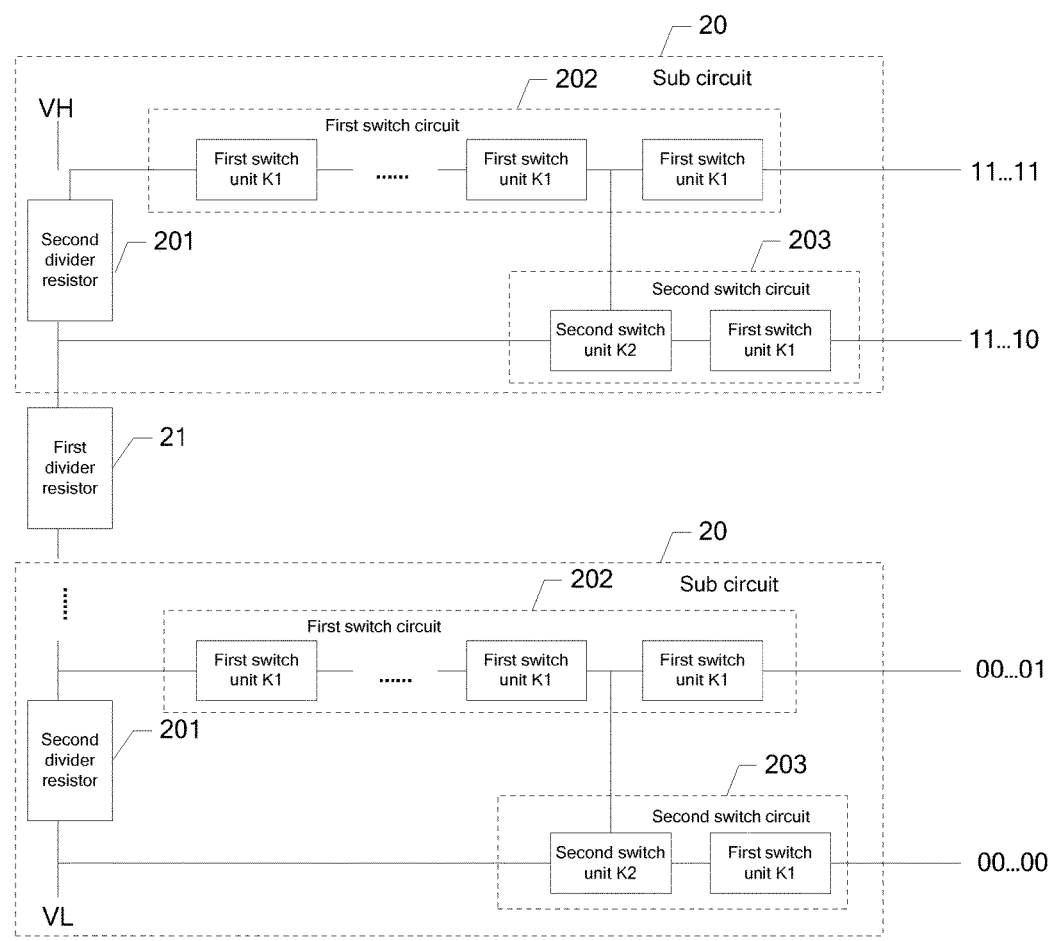
FIG. 2 is a structure diagram of a DAC module provided by one embodiment of the present invention.

Please refer to FIG. 2, which is a structure diagram of a DAC module provided by one embodiment of the present invention. As shown in FIG. 2, the DAC module can comprise 2N−1 sub circuits 20 and 2N−1−1 first divider resistors 21 employed to coupled to the 2N−1 sub circuits, and each sub circuit comprises a second divider resistor 201, a first switch circuit 202 and a second switch circuit 203, wherein:

the first switch circuit 202 and the second switch circuit 203 are respectively coupled to two ends of the second divider resistor 201, and for the first switch circuit 202 or the second switch circuit 203, one end coupled to the second divider resistor 201 is an input end, and the other end is an output end; the first switch circuit 202 comprises N first switch units K1 coupled in series, and the second switch circuit comprises a second switch unit K2 and at least one first switch unit K1 coupled in series; according to a preset order, a control end of the second switch unit K2 is coupled to a connection node of a N−1th first switch unit K1 and a Nth first switch unit K1; an output end of the second switch unit 203 is coupled to the at least one first switch unit K1; wherein the preset order is an order from an input end to an output end, and N≥3 and N is an integer.

In specific embodiment, the resistances of the first divider resistor and the second divider resistor can be the same. The 2N−1th first divider resistor and the 2N−1−1th first divider resistor can form a resistor string consisted of 2N−1 resistors, and two ends of the resistor string respectively receives a high level voltage VH and a low level voltage VL.

In the specific embodiment, the DAC module can convert N bits digital drive data into analog voltages. Preferably, N can be larger than or equal to 8. Control ends of the first N−1 first switch units of each first switch circuit are respectively employed to receive first N−1 bits data of N bits digital drive data; a control end of the Nth first switch unit of each first switch circuit and a control end of the first switch unit of each second switch circuit receive a Nth bit data of the N bits digital drive data. Specifically, The on-off of the first switch unit in the first switch circuit can be controlled with the received data. For instance, as the data received with one first switch unit is 1, the first switch unit is disconnected, and as the received data is 0, the first switch unit is conducted. Specifically, the disconnection of the second switch circuit is jointly determined with the data received by the first switch circuit and the second switch circuit. For instance, as the first N−1 first switch units of the first switch circuit are all conducted, the voltage level outputted by the N−1th first switch unit of the first switch circuit make the second switch unit of the second switch circuit be conducted. If the data received by the last first switch unit in the second switch circuit makes the last first switch unit be conducted, then the entire second switch circuit is conducted.

In the specific embodiment, in the 2N−1 first switch circuits and the 2N−1 second switch circuits of the DAC module, only one circuit is conducted for each time. It can be achieved by setting 0 to N NOT gates in the first switch circuit or setting 0 to 1 NOT gate in the second switch circuit, and making arrangements of the NOT gates of the different first switch units be different. Specifically, for each sub circuit, the first switch circuit and the second switch circuit cannot be conducted at the same time. Thus, if the last first switch unit of the first switch circuit comprises the NOT gate, then the last first switch unit of the second switch circuit does not comprise the NOT gate. Conversely, if the last first switch unit of the first switch circuit does not comprise the NOT gate, then the last first switch unit of the second switch circuit comprises the NOT gate.

As being a possible embodiment, each switch unit can comprise a transistor, and each first switch circuit comprises N transistors, and each second switch circuit comprises at least two transistors, and the DAC module can at least comprise (N+2)*2N−1 transistors. As N≥3, the amount of the transistors in the DAC module is smaller than the amount of the transistors of the DAC module according to prior art.

In the embodiment of the present invention, the DAC module comprises 2N−1 sub circuits and 2N−1−1 first divider resistors employed to coupled to the 2N−1 sub circuits, and each sub circuit comprises a second divider resistor, a first switch circuit and a second switch circuit, and the first switch circuit comprises N first switch units coupled in series, and the second switch circuit comprises a second switch unit and at least one first switch unit coupled in series, and The on-off of the second switch unit in the second switch circuit is controlled with the first switch unit in the first switch circuit to decrease the amount of the transistors in the DAC module, and thus to save the circuit cost and the occupied area of the board.

Figure 3:
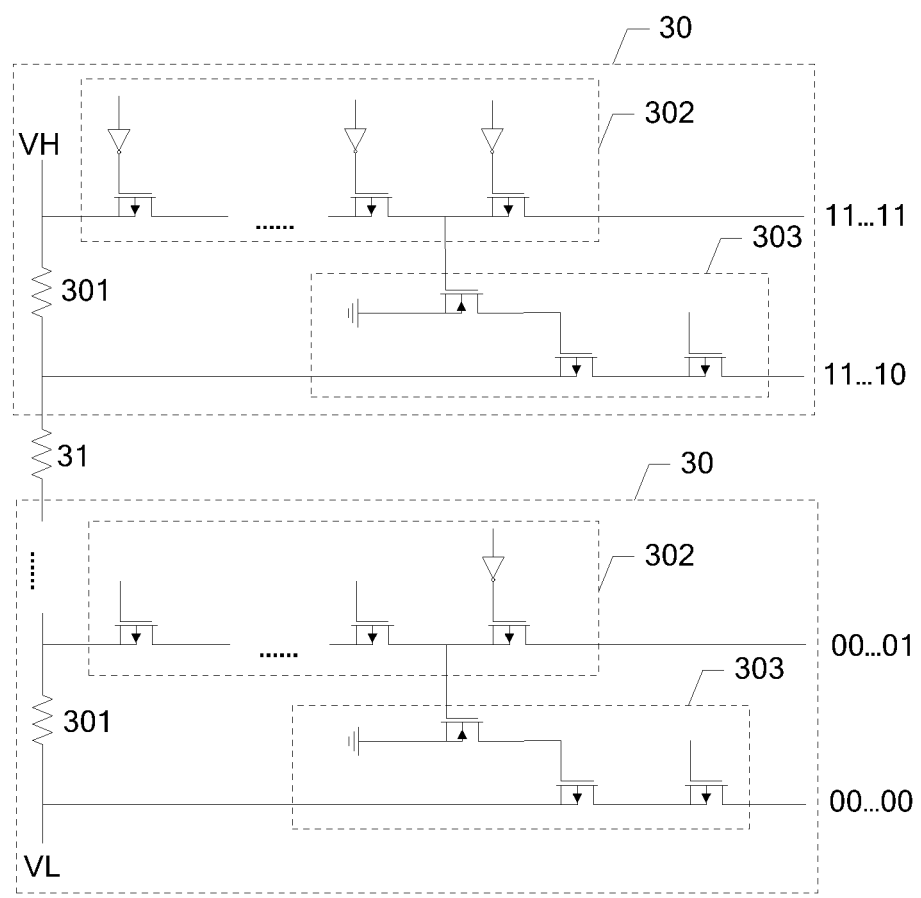
FIG. 3 is a circuit diagram of a DAC module provided by one embodiment of the present invention.

Please refer to FIG. 3, which is a circuit diagram of a DAC module provided by one embodiment of the present invention. As shown in FIG. 3, the DAC module can comprise 2N−1 sub circuits 30 and 2N−1−1 first divider resistors 31 employed to coupled to the 2N−1 sub circuits, and each sub circuit comprises a second divider resistor 301, a first switch circuit 302 and a second switch circuit 303, wherein:

the first switch circuit 302 and the second switch circuit 303 are respectively coupled to two ends of the second divider resistor 301, and for the first switch circuit 302 or the second switch circuit 303, one end coupled to the second divider resistor 301 is an input end, and the other end is an output end; the first switch circuit 302 comprises N first switch units K1 coupled in series, and the second switch circuit comprises a second switch unit K2 and two first switch units K1 coupled in series; according to a preset order, a control end of the second switch unit K2 is coupled to a connection node of a N−1th first switch unit K1 and a Nth first switch unit K1 of the first switch circuit 302; the two first switch units K1 are coupled in series between an output end of the second switch unit K2 and an output end of the second switch circuit, wherein an input end of the first switch unit K1 coupled to the second switch unit K2 is coupled to one end of the second divider resistor 301.

In the specific embodiment, the DAC module can convert N bits digital drive data into analog voltages. Preferably, N can be larger than or equal to 8. Control ends of the first N−1 first switch units of each first switch circuit are respectively employed to receive first N−1 bits data of N bits digital drive data; a control end of the Nth first switch unit of each first switch circuit and a control end of the first switch unit of each second switch circuit receive a Nth bit data of the N bits digital drive data. Specifically, The on-off of the first switch unit in the first switch circuit can be controlled with the received data. For instance, as the data received with one first switch unit is 1, the first switch unit is disconnected, and as the received data is 0, the first switch unit is conducted. Specifically, the disconnection of the second switch circuit is jointly determined with the data received by the first switch circuit and the second switch circuit. For instance, as the first N−1 first switch units of the first switch circuit are all conducted, the voltage level outputted by the N−1th first switch unit of the first switch circuit make the second switch unit of the second switch circuit be conducted. If the data received by the last first switch unit in the second switch circuit makes the last first switch unit be conducted, then the entire second switch circuit is conducted.

In some possible embodiments, in the Nth switch unit K1 of the first switch circuit 301, M first switch units K1 can comprise NOT gates and first transistors coupled in series, and the other N−M first switch units K1 can comprise first transistors, wherein M is an integer and 0≤M≤N. At least one first switch unit K1 of the second switch circuit 303 can comprise 0 or 1 NOT gate, and the second switch unit K2 can comprise a second transistor. By setting 0 to N NOT gates in the first switch circuit or setting 0 to 1 NOT gate in the second switch circuit, and making arrangements of the NOT gates of the different first switch units be different, it can be achieved that in the 2N−1 first switch circuits and the 2N−1 second switch circuits of the DAC module, only one circuit is conducted for each time.

Specifically, for each sub circuit 30, the first switch circuit 302 and the second switch circuit 303 cannot be conducted at the same time. Thus, if the last first switch unit K1 of the first switch circuit 302 comprises the NOT gate, then the last first switch unit K1 of the second switch circuit 303 does not comprise the NOT gate. Conversely, if the last first switch unit K1 of the first switch circuit 302 does not comprise the NOT gate, then the last first switch unit K1 of the second switch circuit 303 comprises the NOT gate.

In some possible embodiments, the first transistor can be a P channel MOS transistor, and the second transistor can be an N channel MOS transistor. The specific connection of each sub circuit can be: a gate of the second transistor is coupled to a drain (or a source) of a N−1th first transistor in the first switch circuit 302 and a source (or a drain) of a Nth first transistor, and a source (or a drain) of the second transistor is grounded, and a drain (or a source) of the second transistor is coupled to a gate of the first first transistor in the second switch circuit 303. A source (or a drain) of the first first transistor is grounded, and a drain (or a source) of the first first transistor is coupled to a source (or a drain) of the second first transistor. A gate of the second first transistor receives the Nth bit data of the N bits digital drive data, and a drain (or a source) is employed to be an output end of the second switch unit. In the specific embodiment, as the first N−1 bits data of N bits digital drive data make the first N−1 first transistors are all conducted, the drain (or the source) of the N−1th first transistor of the first switch circuit outputs the high voltage level to conduct the second transistor. Because the drain (or the source) of the second transistor is grounded to set the gate of the first first transistor in the second switch circuit to be the low voltage level, the first first transistor should be conducted, too. In the last first switch unit of the first switch circuit and the last first switch unit of the second switch circuit, only one comprises the NOT gate. Thus, the Nth bit data of the N bits digital drive data can select one of the last first switch unit of the first switch circuit and the last first switch unit of the second switch circuit to be conducted to output the corresponding analog voltage.

In the embodiment of the present invention, each switch unit can comprise a transistor, and each first switch circuit comprises N transistors, and each second switch circuit comprises 3 transistors, and the DAC module can merely comprise (N+3)*2N−1 transistors. As N≥3, the amount of the transistors in the DAC module is smaller than the amount of the transistors of the DAC module according to prior art.

In some possible embodiments, the resistances of the first divider resistor 31 and the second divider resistor 301 can be the same. The 2N−1th first divider resistor and the 2N−1−1th first divider resistor can form a resistor string consisted of 2N−1 resistors, and two ends of the resistor string respectively receives a high level voltage VH and a low level voltage VL.

In the embodiment of the present invention, the DAC module comprises 2N−1 sub circuits and 2N−1−1 first divider resistors employed to coupled to the 2N−1 sub circuits, and each sub circuit comprises a second divider resistor, a first switch circuit and a second switch circuit, and the first switch circuit comprises N first switch units coupled in series, and the second switch circuit comprises one second switch unit and two first switch units coupled in series, and the on-off of the second switch unit in the second switch circuit and the first first switch unit is controlled with the first N−1 first switch units in the first switch circuit to decrease the amount of the transistors in the DAC module, and thus to save the circuit cost and the occupied area of the board.

Figure 4:
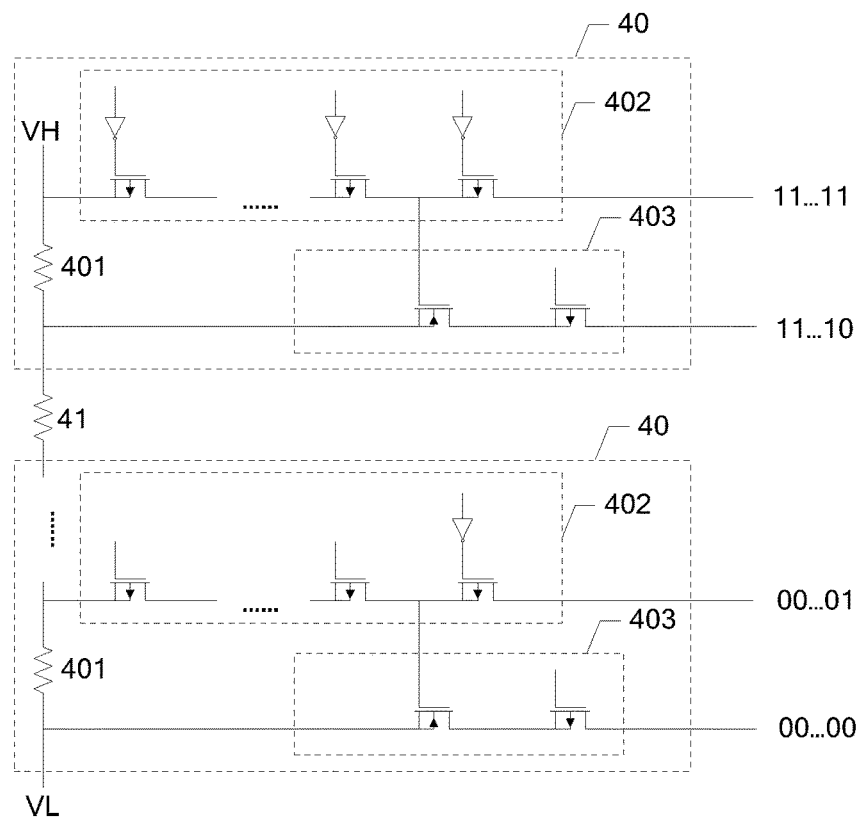
FIG. 4 is a circuit diagram of a DAC module provided by another embodiment of the present invention.

Please refer to FIG. 4, which is a circuit diagram of a DAC module provided by another embodiment of the present invention. As shown in FIG. 4, the DAC module can comprise 2N-1 sub circuits 40 and 2N-1-1 first divider resistors 41 employed to coupled to the 2N-1 sub circuits, and each sub circuit comprises a second divider resistor 401, a first switch circuit 402 and a second switch circuit 403, wherein:

the first switch circuit 402 and the second switch circuit 403 are respectively coupled to two ends of the second divider resistor 401, and for the first switch circuit 402 or the second switch circuit 403, one end coupled to the second divider resistor 401 is an input end, and the other end is an output end; the first switch circuit 402 comprises N first switch units K1 coupled in series, and the second switch circuit comprises a second switch unit K2 and one first switch unit K1 coupled in series; according to a preset order, a control end of the second switch unit K2 is coupled to a connection node of a N-1th first switch unit K1 and a Nth first switch unit K1 of the first switch circuit 402; an input end of the second switch unit K2 is coupled to one end of the second divider resistor 401, and an output end of the second switch unit K2 is coupled to an input end of the one first switch unit K1, and an output end of the one first switch unit K1 is an output end of the second switch circuit 303.

In the specific embodiment, the DAC module can convert N bits digital drive data into analog voltages. Preferably, N can be larger than or equal to 8. Control ends of the first N-1 first switch units of each first switch circuit are respectively employed to receive first N-1 bits data of N bits digital drive data; a control end of the Nth first switch unit of each first switch circuit and a control end of the first switch unit of each second switch circuit receive a Nth bit data of the N bits digital drive data. Specifically, The on-off of the first switch unit in the first switch circuit can be controlled with the received data. For instance, as the data received with one first switch unit is 1, the first switch unit is disconnected, and as the received data is 0, the first switch unit is conducted. Specifically, the disconnection of the second switch circuit is jointly determined with the data received by the first switch circuit and the second switch circuit. For instance, as the first N-1 first switch units of the first switch circuit are all conducted, the voltage level outputted by the N-1th first switch unit of the first switch circuit make the second switch unit of the second switch circuit be conducted. If the data received by the first switch unit in the second switch circuit makes the first switch unit be conducted, then the entire second switch circuit is conducted.

In some possible embodiments, in the Nth switch unit K1 of the first switch circuit 401, M first switch units K1 can comprise NOT gates and first transistors coupled in series, and the other N-M first switch units K1 can comprise first transistors, wherein M is an integer and 0≤M≤N. The one first switch unit K1 of the second switch circuit 403 can comprise 0 or 1 NOT gate, and the second switch unit K2 can comprise a second transistor. In the specific embodiment, in the 2N-1 first switch circuits and the 2N-1 second switch circuits of the DAC module, only one circuit is conducted for each time. It can be achieved by setting 0 to N NOT gates in the first switch circuit or setting 0 to 1 NOT gate in the second switch circuit, and making arrangements of the NOT gates of the different first switch units be different.

Specifically, for each sub circuit 40, the first switch circuit 402 and the second switch circuit 403 cannot be conducted at the same time. Thus, if the last first switch unit K1 of the first switch circuit 402 comprises the NOT gate, then the last first switch unit K1 of the second switch circuit 403 does not comprise the NOT gate. Conversely, if the last first switch unit K1 of the first switch circuit 402 does not comprise the NOT gate, then the last first switch unit K1 of the second switch circuit 403 comprises the NOT gate.

In some possible embodiments, the first transistor can be a P channel MOS transistor, and the second transistor can be an N channel MOS transistor. The specific connection of each sub circuit can be: a gate of the second transistor is coupled to a drain (or a source) of a N-1th first transistor in the first switch circuit 402 and a source (or a drain) of a Nth first transistor, and a source (or a drain) of the second transistor is coupled to one end of the second divider resistor 401, and a drain (or a source) of the second transistor is coupled to a source (or a drain) of the first transistor in the second switch circuit 403, and a gate of the first transistor in the second switch circuit 403 receives the Nth bit data of the N bits digital drive data, and the drain (or source) is employed to be an output end of the second switch unit. In the specific embodiment, as the first N-1 bits data of N bits digital drive data make the first N-1 first transistors are all conducted, the drain (or the source) of the N-1th first transistor of the first switch circuit outputs the high voltage level to conduct the second transistor. In the last first switch unit of the first switch circuit and the last first switch unit of the second switch circuit, only one comprises the NOT gate. Thus, the Nth bit data of the N bits digital drive data can select one of the last first switch unit of the first switch circuit and the last first switch unit of the second switch circuit to be conducted to output the corresponding analog voltage. Because the drain (or the source) of the second transistor is coupled to one end of the second divider resistor 401, and if the first switch unit in the second switch circuit is conducted, the analog voltage outputted by the second switch circuit is the voltage of the one end of the second divider resistor 401.

In the embodiment of the present invention, each switch unit can comprise a transistor, and each first switch circuit comprises N transistors, and each second switch circuit comprises 2 transistors, and the DAC module can merely comprise (N+2)*2N-1 transistors. As N≥3, the amount of the transistors in the DAC module is smaller than the amount of the transistors of the DAC module according to prior art.

In some possible embodiments, the resistances of the first divider resistor 41 and the second divider resistor 401 can be the same. The 2N-1th first divider resistor and the 2N-1-1th first divider resistor can form a resistor string consisted of 2N-1 resistors, and two ends of the resistor string respectively receives a high level voltage VH and a low level voltage VL.

In the embodiment of the present invention, the DAC module comprises 2N-1 sub circuits and 2N-1-1 first divider resistors employed to coupled to the 2N-1 sub circuits, and each sub circuit comprises a second divider resistor, a first switch circuit and a second switch circuit, and the first switch circuit comprises N first switch units coupled in series, and the second switch circuit comprises one second switch unit and one first switch unit coupled in series, and the on-off of the second switch unit in the second switch circuit is controlled with the first N-1 first switch units in the first switch circuit to decrease the amount of the transistors in the DAC module, and thus to save the circuit cost and the occupied area of the board.

Figure 5:
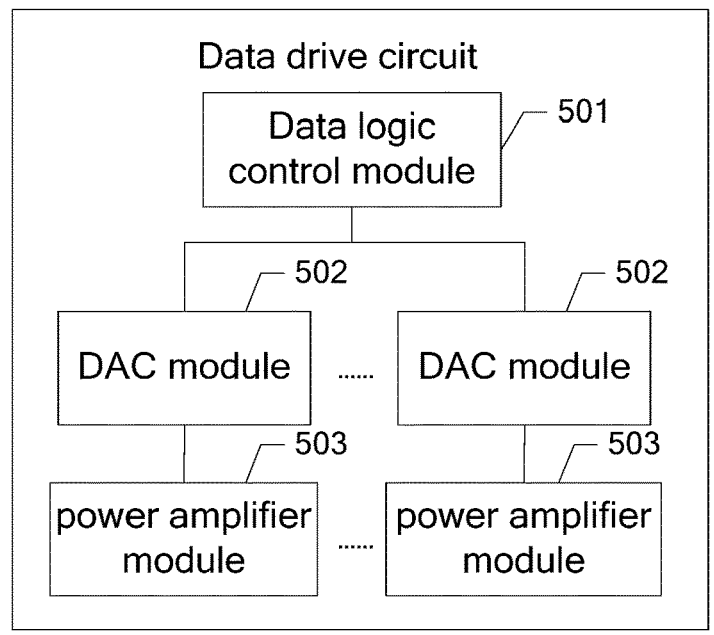
FIG. 5 is a structure diagram of a data drive circuit provided by one embodiment of the present invention.

Please refer to FIG. 5, which is a structure diagram of a data drive circuit provided by one embodiment of the present invention. As shown in FIG. 5, the data drive circuit can comprise a data logic control module 501, at least one DAC module 502 and at least one power amplifier module 503.

In some possible embodiment, the data logic control module 501 can be employed to control the receive and the storage of the display data. The display data is N bits digital drive data. DAC module 502 can be employed to output the corresponding analog voltages according to the received N bits digital drive data. The power amplifier module 503 amplifies the analog voltages outputted by the DAC module 502 for driving the liquid crystal panel to display.

In the specific embodiment, the data drive circuit comprises a plurality of output channels. Each output channel requires one DAC module. Thus, the amount of the at least one DAC module 502 can be consistent with the amount of the output channels of the data drive circuit. For instance, if the data drive circuit has 960 channels, then the data drive circuit comprises the 960 aforesaid DAC modules in total.

In the specific embodiment, the implementation of the at least one DAC module 502 can refer to the related description of the DAC modules in the embodiments shown in FIG. 2 to FIG. 4. The repeated description is omitted here.

According to the description of FIG. 2 to FIG. 4, the data drive circuit can decrease the amount of the transistors in the DAC module, and thus to save the circuit cost and the occupied area of the board.

Figure 6:
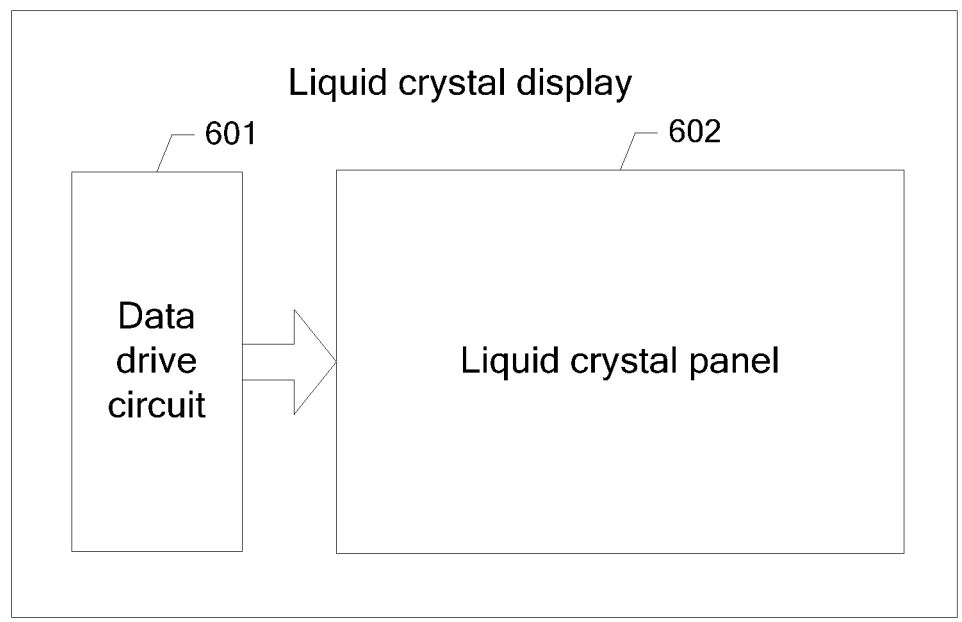
FIG. 6 is a structure diagram of a liquid crystal display provided by one embodiment of the present invention.

Please refer to FIG. 6, which is a structure diagram of a liquid crystal display provided by one embodiment of the present invention. As shown in FIG. 6, the liquid crystal display can comprise a data drive circuit 601 and a liquid crystal panel 602.

In the specific embodiment, the data drive circuit 601 can be employed to drive the liquid crystal panel 602 to display. The implementation of the data drive circuit 601 can refer to the related description of the data drive circuit in the embodiment shown in FIG. 5. The repeated description is omitted here.

According to the description of FIG. 5, the data drive circuit can decrease the amount of the transistors in the DAC module, and thus to save the circuit cost and the occupied area of the board.

Above are embodiments of the present invention, which does not limit the scope of the present invention. Any modifications, equivalent replacements or improvements within the spirit and principles of the embodiment described above should be covered by the protected scope of the invention.

What is claimed is:

1. A digital to analog conversion DAC module, wherein the DAC module comprises 2N−1 sub circuits and 2N−1−1 first divider resistors employed to coupled to the 2N−1 sub circuits, and each sub circuit comprises a second divider resistor, a first switch circuit and a second switch circuit, wherein:
   the first switch circuit and the second switch circuit are respectively coupled to two ends of the second divider resistor, and for the first switch circuit or the second switch circuit, one end coupled to the second divider resistor is an input end, and the other end is an output end;
   the first switch circuit comprises N first switch units coupled in series, and the second switch circuit comprises a second switch unit and at least one first switch unit coupled in series;
   according to a preset order, a control end of the second switch unit is coupled to a connection node of a N−1th first switch unit and a Nth first switch unit; an output end of the second switch unit is coupled to the at least one first switch unit;
   wherein the preset order is an order from an input end to an output end, and N≥3 and N is an integer.

2. The DAC module according to claim 1, wherein the second switch circuit comprises one second switch unit and two first switch units, wherein:
   an input end of the second switch unit is grounded, and an output end of the second switch unit is coupled to a control end of one first switch unit in the two first switch units;
   an input end of the one first switch unit is coupled to one end of the second divider resistor, and an output end of the one first switch unit is coupled to an input end of the other first switch unit in the two first switch units;
   an output end of the other first switch unit is an output end of the second divider resistor.

3. The DAC module according to claim 1, wherein the second switch circuit comprises one second switch unit and one first switch unit, wherein:
   an input end of the second switch unit is coupled to one end of the second divider resistor, and an output end of the second switch unit is coupled to an input end of the one first switch unit, and an output end of the one first switch unit is an output end of the second divider resistor.

4. The DAC module according to claim 1, wherein according to the preset order, as the first N−1 first switch units of the first switch circuit are all conducted, only one of the Nth first switch unit of the first switch circuit and the second switch circuit is conducted.

5. The DAC module according to claim 1, wherein in the Nth first switch unit of the first switch circuit, M first switch units comprise NOT gates and first transistors coupled in series, and N−M first switch units comprise first transistors, wherein M is an integer and 0≤M≤N;
   arrangements of the NOT gates of the respective first switch units in the DAC module are different.

6. The DAC module according to claim 5, wherein the second switch unit comprises a second transistor.

7. The DAC module according to claim 1, wherein according to the preset order, control ends of the first N−1 first switch units of the first switch circuit are respectively employed to receive first N−1 bits data of N bits digital drive data; a control end of the Nth first switch unit of the first switch circuit and a control end of the last first switch unit of the second switch circuit are employed to receive a Nth bit data of the N bits digital drive data.

8. The DAC module according to claim 6, wherein the first transistor is a P channel MOS transistor, and the second transistor is a N channel MOS transistor.

9. A data drive circuit, wherein the data drive circuit comprises a data logic control module, at least one digital to analog conversion DAC module and a power amplifier module, and the DAC module, wherein the DAC module comprises 2N−1 sub circuits and 2N−1−1 first divider resistors employed to coupled to the 2N−1 sub circuits, and each sub circuit comprises a second divider resistor, a first switch circuit and a second switch circuit, wherein:
   the first switch circuit and the second switch circuit are respectively coupled to two ends of the second divider resistor, and for the first switch circuit or the second switch circuit, one end coupled to the second divider resistor is an input end, and the other end is an output end;

the first switch circuit comprises N first switch units coupled in series, and the second switch circuit comprises a second switch unit and at least one first switch unit coupled in series;

according to a preset order, a control end of the second switch unit is coupled to a connection node of a N−1th first switch unit and a Nth first switch unit; an output end of the second switch unit is coupled to the at least one first switch unit;

wherein the preset order is an order from an input end to an output end, and N≥3 and N is an integer.

10. The data drive circuit according to claim 9, wherein the second switch circuit comprises one second switch unit and two first switch units, wherein:

an input end of the second switch unit is grounded, and an output end of the second switch unit is coupled to a control end of one first switch unit in the two first switch units;

an input end of the one first switch unit is coupled to one end of the second divider resistor, and an output end of the one first switch unit is coupled to an input end of the other first switch unit in the two first switch units;

an output end of the other first switch unit is an output end of the second divider resistor.

11. The data drive circuit according to claim 9, wherein the second switch circuit comprises one second switch unit and one first switch unit, wherein:

an input end of the second switch unit is coupled to one end of the second divider resistor, and an output end of the second switch unit is coupled to an input end of the one first switch unit, and an output end of the one first switch unit is an output end of the second divider resistor.

12. The data drive circuit according to claim 9, wherein according to the preset order, as the first N−1 first switch units of the first switch circuit are all conducted, only one of the Nth first switch unit of the first switch circuit and the second switch circuit is conducted.

13. The data drive circuit according to claim 9, wherein in the Nth first switch unit of the first switch circuit, M first switch units comprise NOT gates and first transistors coupled in series, and N−M first switch units comprise first transistors, wherein M is an integer and 0≤M≤N;

arrangements of the NOT gates of the respective first switch units in the DAC module are different.

14. The data drive circuit according to claim 13, wherein the second switch unit comprises a second transistor.

15. The data drive circuit according to claim 9, wherein according to the preset order, control ends of the first N−1 first switch units of the first switch circuit are respectively employed to receive first N−1 bits data of N bits digital drive data; a control end of the Nth first switch unit of the first switch circuit and a control end of the last first switch unit of the second switch circuit are employed to receive a Nth bit data of the N bits digital drive data.

16. The data drive circuit according to claim 14, wherein the first transistor is a P channel MOS transistor, and the second transistor is a N channel MOS transistor.

17. A liquid crystal display, wherein the liquid crystal display comprises a data drive circuit and a liquid crystal panel, and the data drive circuit comprises a data logic control module, at least one digital to analog conversion DAC module and a power amplifier module, and the DAC module, wherein the DAC module comprises 2N−1 sub circuits and 2N−1−1 first divider resistors employed to coupled to the 2N−1 sub circuits, and each sub circuit comprises a second divider resistor, a first switch circuit and a second switch circuit, wherein:

the first switch circuit and the second switch circuit are respectively coupled to two ends of the second divider resistor, and for the first switch circuit or the second switch circuit, one end coupled to the second divider resistor is an input end, and the other end is an output end;

the first switch circuit comprises N first switch units coupled in series, and the second switch circuit comprises a second switch unit and at least one first switch unit coupled in series;

according to a preset order, a control end of the second switch unit is coupled to a connection node of a N−1th first switch unit and a Nth first switch unit; an output end of the second switch unit is coupled to the at least one first switch unit;

wherein the preset order is an order from an input end to an output end, and N≥3 and N is an integer.

18. The liquid crystal display according to claim 17, wherein the second switch circuit comprises one second switch unit and two first switch units, wherein:

an input end of the second switch unit is grounded, and an output end of the second switch unit is coupled to a control end of one first switch unit in the two first switch units;

an input end of the one first switch unit is coupled to one end of the second divider resistor, and an output end of the one first switch unit is coupled to an input end of the other first switch unit in the two first switch units;

an output end of the other first switch unit is an output end of the second divider resistor.

19. The liquid crystal display according to claim 17, wherein the second switch circuit comprises one second switch unit and one first switch unit, wherein:

an input end of the second switch unit is coupled to one end of the second divider resistor, and an output end of the second switch unit is coupled to an input end of the one first switch unit, and an output end of the one first switch unit is an output end of the second divider resistor.

20. The liquid crystal display according to claim 17, wherein according to the preset order, as the first N−1 first switch units of the first switch circuit are all conducted, only one of the Nth first switch unit of the first switch circuit and the second switch circuit is conducted.

* * * * *